(12) United States Patent
Tsukiyama et al.

(10) Patent No.: US 10,943,844 B2
(45) Date of Patent: Mar. 9, 2021

(54) SEMICONDUCTOR DEVICE INCLUDING MULTIPLE CHIPS

(71) Applicant: Toshiba Memory Corporation, Tokyo (JP)

(72) Inventors: Satoshi Tsukiyama, Yokohama Kanagawa (JP); Hideo Aoki, Yokohama Kanagawa (JP); Masatoshi Kawato, Kameyama Mie (JP); Masayuki Miura, Yokkaichi Mie (JP); Masatoshi Fukuda, Yokkaichi Mie (JP); Soichi Homma, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/267,888

(22) Filed: Feb. 5, 2019

(65) Prior Publication Data

US 2019/0393114 A1 Dec. 26, 2019

(30) Foreign Application Priority Data

Jun. 21, 2018 (JP) .............................. JP2018-118175

(51) Int. Cl.
*H01L 23/31* (2006.01)
*H01L 25/18* (2006.01)
*H01L 23/00* (2006.01)
*H01L 23/538* (2006.01)
(Continued)

(52) U.S. Cl.
CPC .......... *H01L 23/3128* (2013.01); *H01L 21/56* (2013.01); *H01L 23/293* (2013.01); *H01L 23/3171* (2013.01); *H01L 23/5384* (2013.01); *H01L 23/5386* (2013.01); *H01L 24/09* (2013.01); *H01L 24/17* (2013.01); *H01L 25/18* (2013.01); *H01L 2224/02381* (2013.01)

(58) Field of Classification Search
CPC ....... H01L 2224/16145; H01L 23/3128; H01L 25/18; H01L 24/09; H01L 24/17
See application file for complete search history.

(56) References Cited

U.S. PATENT DOCUMENTS 6,133,637 A * 10/2000 Hikita ..................... G01P 3/488
257/666
6,391,685 B1 5/2002 Hikita et al.
6,717,251 B2 4/2004 Matsuo et al.
(Continued)

FOREIGN PATENT DOCUMENTS

JP 2002-076251 A 3/2002
JP 4324768 B2 9/2009
(Continued)

*Primary Examiner* — Quoc D Hoang
(74) *Attorney, Agent, or Firm* — Foley & Lardner LLP

(57) ABSTRACT

A semiconductor device includes a first semiconductor chip, a second semiconductor chip thicker than the first semiconductor chip, a plurality of bumps provided between the first and second semiconductor chips and electrically connecting the first and second semiconductor chips, an adhesive resin provided between the first and second semiconductor chips and bonding the first and second semiconductor chips, and a sealing resin encapsulating the first and second semiconductor chips. At least one of the first and second semiconductor chips has an organic protective film disposed thereon.

13 Claims, 2 Drawing Sheets

(51) Int. Cl.
  *H01L 23/29* (2006.01)
  *H01L 21/56* (2006.01)

(56) References Cited

U.S. PATENT DOCUMENTS

| | | |
|---|---|---|
| 8,338,890 B2 | 12/2012 | Saiki et al. |
| 8,941,246 B2 | 1/2015 | Miura et al. |
| 2011/0237026 A1* | 9/2011 | Farooq ................ H01L 21/6835 438/107 |
| 2012/0001324 A1* | 1/2012 | Aoki ................... H01L 25/0657 257/737 |
| 2013/0075895 A1 | 3/2013 | Miura et al. |
| 2015/0162265 A1* | 6/2015 | Jo ........................... H01L 24/97 257/774 |
| 2017/0047309 A1* | 2/2017 | Baek ................... H01L 25/0657 |

FOREIGN PATENT DOCUMENTS

| | | |
|---|---|---|
| JP | 2010-258227 A | 11/2010 |
| JP | 2015-153985 A | 8/2015 |

* cited by examiner

SEMICONDUCTOR DEVICE INCLUDING MULTIPLE CHIPS

CROSS-REFERENCE TO RELATED APPLICATION

This application claims the benefit of and priority to Japanese Patent Application No. 2018-118175, filed Jun. 21, 2018, the entire contents of which are incorporated herein by reference.

FIELD

Embodiments described herein relate generally to a semiconductor device and a method for manufacturing the same.

BACKGROUND

To attain miniaturization and high functionality of a semiconductor device, a semiconductor package in which a plurality of semiconductor memory chips interconnected by through-vias and microbumps may be stacked in layers. In a semiconductor memory chip stacked structure in which semiconductor memory chips each having a surface with a semiconductor element formed thereon, facing up, are stacked in layers on each other, a semiconductor package may be configured such that a thickness of a memory chip at the lowermost layer is greater than a thickness of the other memory chips.

DETAILED DESCRIPTION

Figure 1:
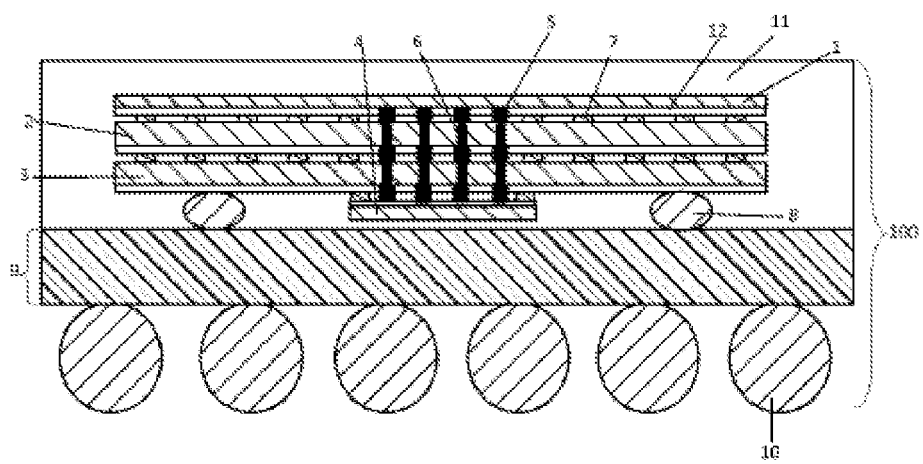
FIG. 1 is a diagram illustrating an example configuration of a semiconductor device according to an embodiment.

Embodiments described herein provide for a semiconductor device with an increased reliability of junctions between semiconductor chips and a method for manufacturing the same.

In general, according to one embodiment, a semiconductor device includes a first semiconductor chip, a second semiconductor chip thicker than the first semiconductor chip, a plurality of bumps provided between the first and second semiconductor chips and electrically connecting the first and second semiconductor chips, an adhesive resin provided between the first and second semiconductor chips and bonding the first and second semiconductor chips, and a sealing resin encapsulating the first and second semiconductor chips. At least one of the first and second semiconductor chips has an organic protective film disposed thereon.

Hereinafter, embodiments of the present disclosure will be described.

A semiconductor device according to an embodiment is described with reference to the drawings.

In the drawings, the same or similar components or portions are denoted by same reference characters. The drawings are schematic and may differ from certain implementations in practice, for example, with respect to a relationship or a ratio between a thickness and a plane dimension.

A configuration of the semiconductor device according to the present embodiment is described with reference to FIG. 1. FIG. 1 is a sectional view illustrating the configuration of the semiconductor device according to the present embodiment.

As illustrated in FIG. 1, a semiconductor device 100 according to the present embodiment has a semiconductor chip stacked structure in which a first semiconductor chip 1, a second semiconductor chip 2, a third semiconductor chip 3, and a fourth semiconductor chip 4 are stacked in layers. Each of the first semiconductor chip 1, the second semiconductor chip 2, and the third semiconductor chip 3 may be a memory chip such as a NAND flash memory, and the fourth semiconductor chip 4 may be an interface (IF) chip. The IF chip is provided with an IF circuit used to perform data communication between a memory chip and an external device.

Each of the first semiconductor chip 1, the second semiconductor chip 2, the third semiconductor chip 3, and the fourth semiconductor chip 4 includes a semiconductor substrate that includes, for example, silicon, and a semiconductor element provided on the semiconductor substrate.

Figure 4:
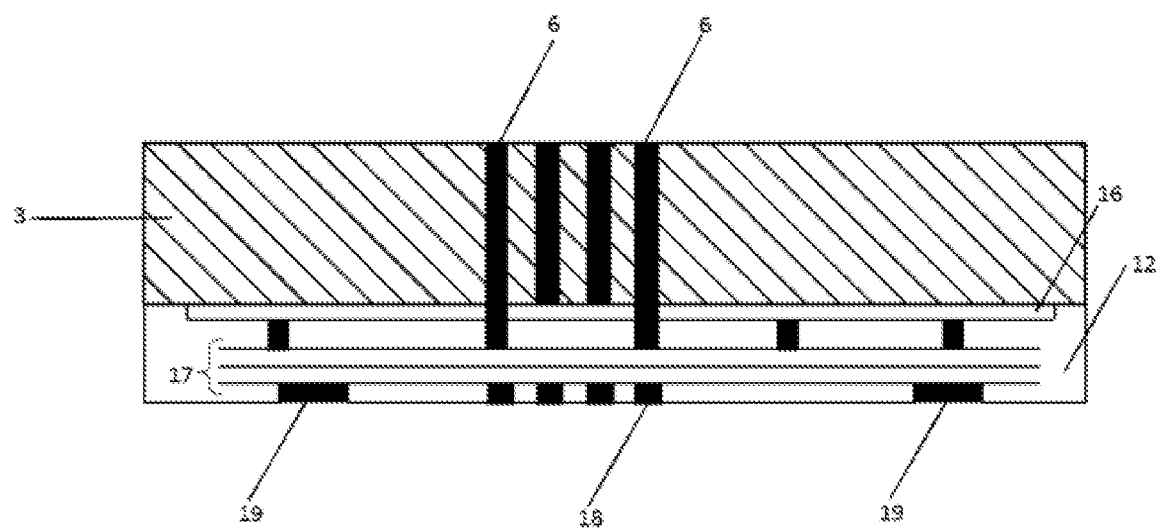
FIG. 4 is a diagram illustrating an example configuration of a semiconductor chip according to an embodiment.

As illustrated in FIG. 4, for example, the semiconductor chip 3 includes the semiconductor element 16. The first semiconductor chip 1, the second semiconductor chip 2 and the fourth semiconductor chip 4 may be similar to the semiconductor chip 3. Here, assuming that a surface of the semiconductor substrate on which the semiconductor element is provided is a circuit (first) surface and the opposite surface thereof is a back (second) surface, the first semiconductor chip 1, the second semiconductor chip 2, and the third semiconductor chip 3 are stacked in layers in such a manner that the circuit surfaces of the respective semiconductor substrates face in a same direction (e.g., downward as viewed in FIG. 1, or towards the fourth semiconductor chip 4), while the fourth semiconductor chip 4 is stacked in such a manner that the circuit surface of the semiconductor substrate of the fourth semiconductor chip 4 faces in the opposite direction (e.g., upward as viewed in FIG. 1, or towards from the first semiconductor chip 1, the second semiconductor chip 2, and/or the third semiconductor chip 3).

The thickness of the first semiconductor chip 1 is less than the thickness of each of the second semiconductor chip 2, the third semiconductor chip 3, and the fourth semiconductor chip 4. The semiconductor substrate of the first semiconductor chip 1 may be subjected to thin-film processing in such a way as to become thinner than the semiconductor substrate of each of the second semiconductor chip 2, the third semiconductor chip 3, and the fourth semiconductor chip 4. The first semiconductor chip 1 may be made thinner than each of the second semiconductor chip 2, the third semiconductor chip 3, and the fourth semiconductor chip 4.

Thin-film processing may be implemented by performing, for example, grinding of the semiconductor substrate. For example, the thickness of the first semiconductor chip 1 is set to less than about 30 micrometers (μm) (e.g., to less than about 25 μm, or to less than about 20 μm), and the thickness of each of the second semiconductor chip 2, the third semiconductor chip 3, and the fourth semiconductor chip 4 is set to be in a range of about 30 μm to about 50 μm, or to be in a range of about 40 μm to about 50 μm. The thickness of each of the second semiconductor chip 2, the third semiconductor chip 3, and the fourth semiconductor chip 4, may about 1 μm or more, about 5 μm or more, about 10 μm or more, or about 30 μm or more than the thickness of the first semiconductor chip 1.

As illustrated in FIG. 4, an organic protective film 12 is formed on the semiconductor element 16 of each of the first semiconductor chip 1, the second semiconductor chip 2, the third semiconductor chip 3 and the fourth semiconductor chip 4. Various organic insulating materials may be included in the organic protective film 12, such as, for example, a polyimide resin film, a phenolic resin film, an acrylic resin film, a polybenzoxazole resin film, or a polybenzocyclobutene resin film. The organic protective film may be a single layer film or a multiple layer film. The organic protective film 12 includes, for example, a passivation film used to protect internal circuit wiring of the semiconductor chips.

As illustrated in FIG. 4, a rewiring layer 17 (e.g., a redistribution layer (RDL)) electrically connected to the semiconductor element 16 may be provided in the organic protective film 12.

A micro pad 18 and a large pad 19 are provided in the rewiring layer 17 of the third semiconductor chip 3. the micro pad 18 and the large pad 19 are electrically connected to the rewiring layer 17. In some embodiments, the large pad 19 may be omitted from, or may not be electrically connected to the rewiring layer 17 of, the first semiconductor chip 1, the second semiconductor chip 2 and the fourth semiconductor chip 4.

The first semiconductor chip 1, the second semiconductor chip 2, the third semiconductor chip 3 and the fourth semiconductor chip 4 are electrically interconnected via bumps 5. The bumps 5 are provided on the micro pad 18 and on a through-via 6.

The material used to make the bump 5 includes, for example, an alloy of Sn and, for example, Cu, Ag, Bi, or In, and may include Cu, Ni, Au, Ag, Pd, and Sn. The bump 5 provided between the respective semiconductor chips is a microbump, and the pitch between bumps is about 10 μm to about 100 μm and the diameter of the bump is about 5 μm to about 50 μm. The through-via 6 is configured with an electrical conducting material, such as Cu, Ni, or W, and is provided in such way as to penetrate through the respective semiconductor substrates of the second semiconductor chip 2 and the third semiconductor chip 3. In some embodiments, the through-via 6 may be omitted from the first semiconductor chip 1 and the fourth semiconductor chip 4.

The through-via 6 may be directly connected to the rewiring layer 17.

The rewiring layer 17 of the first semiconductor chip 1 and the through-via 6 of the second semiconductor chip 2 are electrically connected via the bumps 5.

The rewiring layer 17 of the second semiconductor chip 2 and the through-via 6 of the third semiconductor chip 3 are electrically connected via the bumps 5.

The rewiring layer 17 of the third semiconductor chip 3 and the rewiring layer 17 of the fourth semiconductor chip 4 are electrically connected via the bumps 5.

Each bump 5 is joined to a respective aperture area provided in the organic protective film 12 on each semiconductor chip surface, for example, to a surface on which a micro pad 18 is exposed.

An adhesive resin 7, which can also serve as a stopper (e.g., during manufacture), is formed between each adjacent pair of the first semiconductor chip 1, the second semiconductor chip 2, the third semiconductor chip 3, and the fourth semiconductor chip 4. The adhesive resin 7 also serving as a stopper not only functions as a stopper member used to maintain a clearance between stacked semiconductor chips but also functions as an adhesive member used to perform adhesion in a space between the semiconductor chips at a stage of manufacture prior to the space being filled with a sealing resin. The adhesive resin 7 is formed from a resin having a photosensitivity and a thermosetting property. Specific examples of the resin having photosensitivity and thermosetting property include a thermosetting resin containing a photosensitizing agent such as a photosensitive adhesive resin. For example, the adhesive resin 7 includes an epoxy resin, a polyimide resin, an acrylic resin, or a phenolic resin. The adhesive resin 7 differs in thermal expansion coefficient from a silicon substrate, which is used as a semiconductor substrate of the semiconductor chip, and the organic protective film 12.

The third semiconductor chip 3 is electrically connected to an interconnection substrate 9 via the large pad 19 and large bumps 8.

The large bump 8 is joined to an aperture area provided in the organic protective film 12 on the third semiconductor chip 3 surface, for example, to a surface on which a large pad 18 is exposed.

The large bump 8 is larger in diameter than the bump 5, and may be made from a material similar to that of the bump 5. The interconnection substrate 9 may include a resin material, inside which wires made from, for example, copper are arranged. The interconnection substrate 9 has a structure extending to an outer side of an area just below the third semiconductor chip 3, and a semiconductor chip other than the third semiconductor chip 3 can be mounted on the interconnection substrate 9. Solder balls (e.g., of a ball grid array (BGA)) 10 are formed on the interconnection substrate 9. The semiconductor chip is electrically connected to an external device via the large bumps 8, internal wiring of the interconnection substrate 9, and the solder balls 10.

The large pad 19 of the third semiconductor chip 3 is provided at a position not overlapping with the fourth semiconductor chip 4 as seen from a direction in which the first semiconductor chip 1 and the second semiconductor chip 2 are stacked.

The large pad 19 has a larger contact area than the pad 18 (e.g., by a factor of about 2 or more, about 4 or more, or about 6 or more).

The pad 18 has a diameter of about 5 μm to about 50 μm, and in some embodiments a diameter of the bump 5 is about 5 μm to about 50 μm.

A sealing resin 11 such as an epoxy resin is formed between and around the respective semiconductor chips on the interconnection substrate 9 to mold each semiconductor chip. The sealing resin may be used to encapsulate the respective semiconductor chips on the interconnection substrate 9. Areas in which no adhesive resin 7 is formed on the organic protective film 12 may be filled with the sealing resin 11.

Next, a method for manufacturing the semiconductor device according to the present embodiment is described with reference to FIGS. 2A and 2B.

Figure 2A:
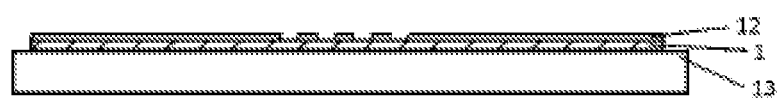
FIGS. 2A and 2B are diagrams illustrating an example method for manufacturing the semiconductor device according to the embodiment.

First, as illustrated in FIG. 2A, the method includes providing the first semiconductor chip 1 having a semiconductor element, a circuit wiring, and an organic protective film 12 formed on a semiconductor substrate, and mounting the first semiconductor chip 1 with the circuit surface thereof facing upward on a lead frame 13. Some portions of the organic protective film 12 are provided with apertures, via which some of circuits of the first semiconductor chip 1, for example, electrode pads, are exposed. The semiconductor substrate of the first semiconductor chip 1 is formed into a thin film by, for example, back-grinding, or another appropriate technique.

Figure 2B:
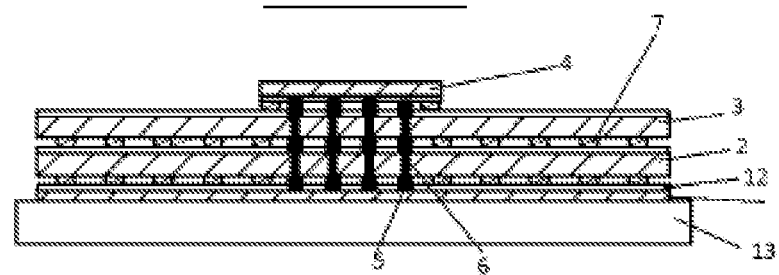

Next, as illustrated FIG. 2B, the method includes sequentially stacking the second semiconductor chip 2, the third semiconductor chip 3, and the fourth semiconductor chip 4 on the first semiconductor chip 1 in layers. The second semiconductor chip 2 and the third semiconductor chip 3 have the through-vias 6 penetrating through the semiconductor substrates and the bumps 5 provided at ends of the through-vias 6, and also have the adhesive resin 7 provided on the substrate back surface at the same side as the bumps 5. The circuit surface of the fourth semiconductor chip 4 also has the bumps 5 and the adhesive resin 7 formed thereon. While the organic protective film 12 is formed on the circuit surface of each of the second semiconductor chip 2 and the third semiconductor chip 3, some portions of the organic protective film 12 are provided with apertures, on which some of circuits, for example, electrode pads, are exposed. Here, the thickness of each of the second semiconductor chip 2, the third semiconductor chip 3, and the fourth semiconductor chip 4 is greater than the thickness of the first semiconductor chip 1.

When stacking the second semiconductor chip 2 on the first semiconductor chip 1, the method may include position adjustment in such a manner that the bumps 5 of the second semiconductor chip 2 are joined to the electrode pads of the first semiconductor chip 1, and the method may include thermal compression bonding of the two chips. The temperature used for thermal compression bonding is, for example, about 250 degrees Celsius to about 280 degrees Celsius. The method may include adhesive joining and setting the inter-substrate distance between the second semiconductor chip 2 and the first semiconductor chip 1 by bringing the adhesive resin 7 of the second semiconductor chip 2 into contact with the first semiconductor chip 1 and performing heating prior to or at the same time of bump heating. When stacking the third semiconductor chip 3 on the second semiconductor chip 2 and when stacking the fourth semiconductor chip 4 on the third semiconductor chip 3, the method can include joining the two chips in a similar way. Furthermore, the adhesive resin 7 may be previously formed on a semiconductor chip serving as a lower layer used for joining, and, in this case, a semiconductor chip serving as an upper layer may omit being provided with the adhesive resin 7.

When a semiconductor chip is heated, an organic protective film undergoing change of form via the heating may in some cases cause warpage in the semiconductor chip. While the thermal expansion coefficient of a silicon substrate of the semiconductor chip may be about 3 ppm, the thermal expansion coefficient of an organic protective film is relatively large, and, for example, the thermal expansion coefficient of a polyimide resin is about 35 ppm. Here, in a case where some of the stacked semiconductor chips, for example, a semiconductor chip at the lowermost layer serving as a base at the time of chip stacking, is thicker than the other chips, the semiconductor chip at the lowermost layer becomes unable or less able to follow warpage in the other semiconductor chips. Since the semiconductor chip at the lowermost layer differs in the amount of warpage from a semiconductor chip at a layer higher than the lowermost layer, an adhesive resin formed between those semiconductor chips may expand and, as a result, there is a possibility that bumps joining the two chips will break. In particular, bumps with small diameters, such as microbumps, may be relatively weak in mechanical strength, and are, therefore, more likely to break. On the other hand, with regard to the semiconductor device according to the present embodiment, since the thickness of the first semiconductor chip 1 at the lowermost layer serving as a base at the time of chip stacking is less than the thickness of each of the second semiconductor chip 2, the third semiconductor chip 3, and the fourth semiconductor chip 4 used for stacking, warpage also occurs in the first semiconductor chip 1 following warpage in the second semiconductor chip 2, the third semiconductor chip 3, and the fourth semiconductor chip 4, so that the adhesive resin 7 between the respective chips can be prevented from expanding and, as a result, bumps joining the first semiconductor chip 1 and the second semiconductor chip 2 at the layer upper than the first semiconductor chip 1 can be prevented from breaking.

Moreover, as compared with a case of stacking semiconductor chips all with the same thickness, making the first semiconductor chip 1 at the lowermost layer thinner than the other semiconductor chips enables restraining the amount of warpage of the entire stacked body of the first to third semiconductor chips and, for example, enables setting the amount of warpage less than or equal to several tens of μm (e.g. to less than or equal to about 70 μm, to less than or equal to about 50 μm, or to less than or equal to about 30 μm). Therefore, pressures that are applied to the large bumps 8, which interconnect the stacked body of semiconductor chips and the interconnection substrate 9, can be reduced, so that the large bumps 8 can be prevented from breaking. After the state illustrated in FIG. 2B, although omitted from illustration, the method may include joining a group of stacked semiconductor chips to the interconnection substrate 9 via the large bumps 8 in such a manner that the circuit forming surface of the third semiconductor chip 3 faces the interconnection substrate 9, and then molding the group of stacked semiconductor chips with the sealing resin 11, thus providing for a semiconductor device according to the present embodiment. The heating curing temperature of the sealing resin 11 is, for example, about 180 degrees Celsius.

Modification Example

A modification example of the semiconductor device according to the present embodiment is described with reference to FIG. 3. Furthermore, in the illustration in FIG. 3, the same or similar portions or components as those in FIG. 1 are denoted by same reference characters.

A semiconductor device according to the present modification example differs from the semiconductor device according to the embodiment at least in that a first semiconductor chip is formed on a supporting substrate via a die attach film (DAF).

Figure 3:
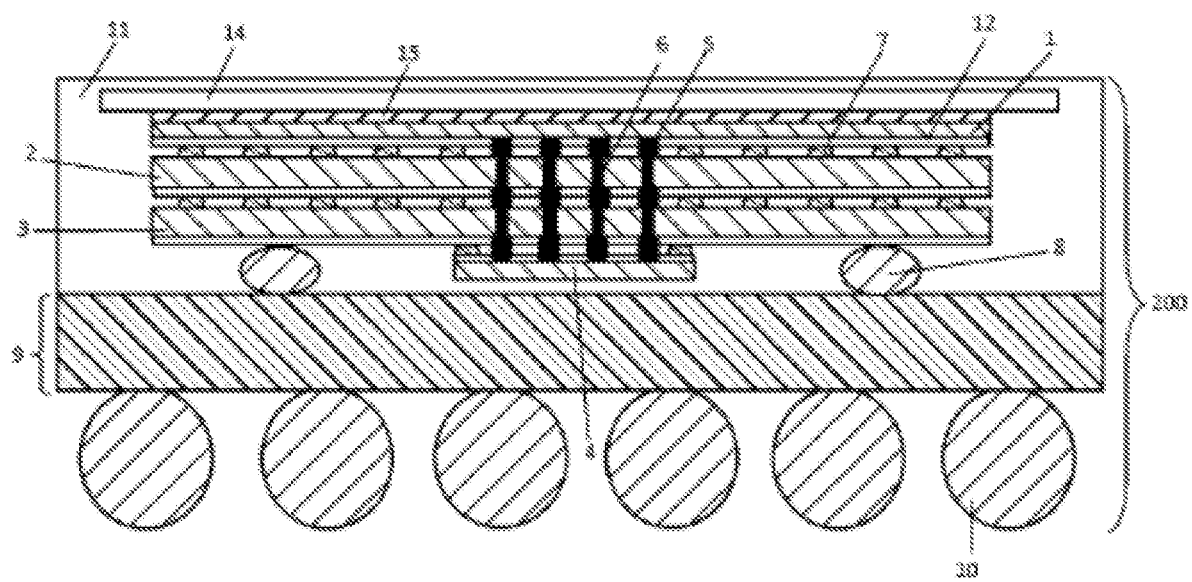
FIG. 3 is a diagram illustrating an example configuration of a semiconductor device according to a modification example of the embodiment.

As illustrated in FIG. 3, in a semiconductor device 200 according to the present modification example, the first semiconductor chip 1 is formed or provided on a supporting substrate 14 via a DAF 15. The supporting substrate 14 is a substrate which supports the first semiconductor chip 1, such as a lead frame or a silicon substrate. The DAF 15 includes a film material containing an organic resin material, and bonds the supporting substrate 14 and the first semiconductor chip 1.

In the present modification example, since the thickness of the first semiconductor chip 1 is less than the thickness of each of the second, third, and fourth semiconductor chips, the bumps 5 between the first semiconductor chip 1 and the second semiconductor chip 2 can be prevented from breaking due to warpage of substrates at the time of heating thermocompression bonding of chips.

Moreover, since semiconductor chips is mounted on the interconnection substrate 9 with a plurality of semiconductor chips provided on the supporting substrate 14, conveyance and handling of stacked chips can be readily accomplished.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
   a wiring substrate;
   a first semiconductor chip provided on the wiring substrate;
   a second semiconductor chip provided on the wiring substrate, the second semiconductor chip having a substantially same size as the first semiconductor chip but thicker than the first semiconductor chip;
   a plurality of bumps provided between the first and second semiconductor chips and electrically connecting the first and second semiconductor chips;
   an adhesive resin provided between the first and second semiconductor chips and bonding the first and second semiconductor chips; and
   a sealing resin encapsulating the first and second semiconductor chips,
   wherein at least one of the first semiconductor chip or second semiconductor chip has an organic protective film disposed thereon, and
   wherein a distance between the wiring substrate and the second semiconductor chip is shorter than a distance between the wiring substrate and the first semiconductor chip.

2. The semiconductor device according to claim 1, wherein each of the first and second semiconductor chips is a memory chip.

3. The semiconductor device according to claim 1, further comprising a third semiconductor chip provided between the second semiconductor chip and the wiring substrate, wherein the second and third semiconductor chips are electrically interconnected via a plurality of through-vias provided in the second semiconductor chip and a plurality of bumps provided between the second and third semiconductor chips.

4. The semiconductor device according to claim 1, wherein a thickness of the first semiconductor chip is less than 30 micrometers (μm).

5. The semiconductor device according to claim 1, wherein a thickness of the second semiconductor chip is in a range of 30 μm to 50 μm.

6. The semiconductor device according to claim 1, wherein a pitch between the bumps is in a range of about 10 μm to about 100 μm.

7. The semiconductor device according to claim 1, further comprising a plurality of through-vias that include at least one of copper (Cu), nickel (Ni), or tungsten (W).

8. A semiconductor device comprising:
   a wiring substrate;
   a first semiconductor chip provided on the wiring substrate;
   a second semiconductor chip bonded to the first semiconductor chip, the second semiconductor chip having a substantially same size as the first semiconductor chip and comprising a rewiring layer; and
   a third semiconductor chip bonded to the second semiconductor chip,
   wherein a thickness of the first semiconductor chip is less than a thickness of the second semiconductor chip and is less than a thickness of the third semiconductor chip,
   a first distance between the wiring substrate and the second semiconductor chip is shorter than a second distance between the wiring substrate and the first semiconductor chip,
   a third distance between the wiring substrate and the third semiconductor chip is shorter than the first distance between the wiring substrate and the second semiconductor chip.

9. The semiconductor device according to claim 8, wherein the thickness of the first semiconductor chip is less than 30 micrometers (μm).

10. The semiconductor device according to claim 9, wherein the thicknesses of the second semiconductor chip and the third semiconductor chip are in a range of 30 μm to 50 μm.

11. The semiconductor device according to claim 8, further comprising a first pad and a second pad electrically connected to the rewiring layer.

12. The semiconductor device according to claim 11, wherein the first pad has a diameter in a range of 5 μm to 50 μm, and is electrically connected to a bump having a diameter in a range of 5 μm to 50 μm.

13. The semiconductor device according to claim 12, wherein the second pad has a larger contact area than a contact area of the first pad by a factor of 2 or more, the second pad physically connected to the wiring substrate.

* * * * *